United States Patent
Davis

Patent Number: 5,248,900
Date of Patent: Sep. 28, 1993

[54] TIME-SLICED MODULAR PULSE-WIDTH MODULATION CIRCUIT

[75] Inventor: Derek Davis, Phoenix, Ariz.

[73] Assignee: Intel Corporation, Santa Clara, Calif.

[21] Appl. No.: 813,965

[22] Filed: Dec. 24, 1991

[51] Int. Cl.$^5$ .......................... H03K 5/04; H03K 5/15
[52] U.S. Cl. ..................... 307/265; 328/58; 328/62; 377/39
[58] Field of Search ................... 307/265; 328/58, 62; 377/39

[56] References Cited

U.S. PATENT DOCUMENTS

| | | | |
|---|---|---|---|
| 4,870,665 | 9/1989 | Vaughn | 328/58 |
| 4,881,040 | 11/1989 | Vaughn | 377/39 |
| 5,045,800 | 9/1991 | Kung | 307/265 |
| 5,177,373 | 1/1992 | Nakamura | 307/265 |

*Primary Examiner*—John S. Heyman
*Attorney, Agent, or Firm*—Blakely, Sokoloff, Taylor & Zafman

[57] ABSTRACT

A PWM output device using time-multiplexing to create multiple time-bases from a common time-base counter and thereby supporting multiple PWM output signals capable of having different periods and duty cycles. A circulating timer shifts to provide various fundamental time-bases to each PWM module, which sets and resets its PWM output upon a proper state determined by a looping state counter. When the state counter reaches 0, it causes the circulating counter to increment and the state counter to reload. As the circulating counter shifts, it generates a plurality of values to be used as the fundamental timebases for the PWM modules. Each PWM module comprises a time-base match unit, a duty cycle control unit, and an output control unit. The time-base match unit in each individual PWM module determines when the time base produced by the circulating counter is valid by comparing its preset valid state value with the state value from the state counter. The duty cycle control unit determines when the PWM output should be set and reset so as to produce the duty cycle for each PWM output signal by comparing its preset value with the value of the circulating counter. The output control unit enables the PWM output signal when the state values are matched between the state counter and the preset state value and the duty cycle is validly triggered.

6 Claims, 10 Drawing Sheets

| STATE COUNTER | | CIRCULATING TIME-BASE COUNTER | |
|---|---|---|---|
| STATE | ACTION | STATE | ACTION |
| 0 | RELOAD | CIRCULATING TIME-BASE COUNTER (CTBC)<br>8, 9, 10, 11, 12, 13, 14, _<br>7, 6, 5, 4, 3, 2, 1, 0 | INCREMENT |
| M (IF M>15) | DECREMENT | CIRCULATING TIME-BASE COUNTER (CTBC)<br>8, 9, 10, 11, 12, 13, 14, _<br>7, 6, 5, 4, 3, 2, 1, 0 | NONE |
| N (M>N>15) | DECREMENT | CIRCULATING TIME-BASE COUNTER (CTBC)<br>8, 9, 10, 11, 12, 13, 14, _<br>7, 6, 5, 4, 3, 2, 1, 0 | NONE |
| 15 | DECREMENT | CIRCULATING TIME-BASE COUNTER (CTBC)<br>8, 9, 10, 11, 12, 13, 14, _<br>7, 6, 5, 4, 3, 2, 1, 0 | ROTATE |
| 14 | DECREMENT | CIRCULATING TIME-BASE COUNTER (CTBC)<br>7, 8, 9, 10, 11, 12, 13, _<br>6, 5, 4, 3, 2, 1, 0, 14 | ROTATE |
| 13 | DECREMENT | CIRCULATING TIME-BASE COUNTER (CTBC)<br>6, 7, 8, 9, 10, 11, 12, _<br>5, 4, 3, 2, 1, 0, 14, 13 | ROTATE |
| 12 | DECREMENT | CIRCULATING TIME-BASE COUNTER (CTBC)<br>5, 6, 7, 8, 9, 10, 11, _<br>4, 3, 2, 1, 0, 14, 13, 12 | ROTATE |

FIGURE 7

(PAGE 1 OF 3)

| STATE COUNTER | | CIRCULATING TIME-BASE COUNTER | |
|---|---|---|---|
| STATE | ACTION | STATE | ACTION |
| 11 | DECREMENT | CIRCULATING TIME-BASE COUNTER (CTBC)<br>\| 4 \| 5 \| 6 \| 7 \| 8 \| 9 \| 10 \|   \|<br>\| 3 \| 2 \| 1 \| 0 \| 14 \| 13 \| 12 \| 11 \| | ROTATE |
| 10 | DECREMENT | CIRCULATING TIME-BASE COUNTER (CTBC)<br>\| 3 \| 4 \| 5 \| 6 \| 7 \| 8 \| 9 \|   \|<br>\| 2 \| 1 \| 0 \| 14 \| 13 \| 12 \| 11 \| 10 \| | ROTATE |
| 9 | DECREMENT | CIRCULATING TIME-BASE COUNTER (CTBC)<br>\| 2 \| 3 \| 4 \| 5 \| 6 \| 7 \| 8 \|   \|<br>\| 1 \| 0 \| 14 \| 13 \| 12 \| 11 \| 10 \| 9 \| | ROTATE |
| 8 | DECREMENT | CIRCULATING TIME-BASE COUNTER (CTBC)<br>\| 1 \| 2 \| 3 \| 4 \| 5 \| 6 \| 7 \|   \|<br>\| 0 \| 14 \| 13 \| 12 \| 11 \| 10 \| 9 \| 8 \| | ROTATE |
| 7 | DECREMENT | CIRCULATING TIME-BASE COUNTER (CTBC)<br>\| 0 \| 1 \| 2 \| 3 \| 4 \| 5 \| 6 \|   \|<br>\| 14 \| 13 \| 12 \| 11 \| 10 \| 9 \| 8 \| 7 \| | ROTATE |
| 6 | DECREMENT | CIRCULATING TIME-BASE COUNTER (CTBC)<br>\| 14 \| 0 \| 1 \| 2 \| 3 \| 4 \| 5 \|   \|<br>\| 13 \| 12 \| 11 \| 10 \| 9 \| 8 \| 7 \| 6 \| | ROTATE |
| 5 | DECREMENT | CIRCULATING TIME-BASE COUNTER (CTBC)<br>\| 13 \| 14 \| 0 \| 1 \| 2 \| 3 \| 4 \|   \|<br>\| 12 \| 11 \| 10 \| 9 \| 8 \| 7 \| 6 \| 5 \| | ROTATE |

FIGURE 7

(PAGE 2 OF 3)

| STATE COUNTER | | CIRCULATING TIME-BASE COUNTER | |
|:---:|:---:|:---:|:---:|
| STATE | ACTION | STATE | ACTION |
| 4 | DECREMENT | CIRCULATING TIME-BASE COUNTER (CTBC)<br>\| 12 \| 13 \| 14 \| 0 \| 1 \| 2 \| 3 \| \|<br>\| 11 \| 10 \| 9 \| 8 \| 7 \| 6 \| 5 \| 4 \| | ROTATE |
| 3 | DECREMENT | CIRCULATING TIME-BASE COUNTER (CTBC)<br>\| 11 \| 12 \| 13 \| 14 \| 0 \| 1 \| 2 \| \|<br>\| 10 \| 9 \| 8 \| 7 \| 6 \| 5 \| 4 \| 3 \| | ROTATE |
| 2 | DECREMENT | CIRCULATING TIME-BASE COUNTER (CTBC)<br>\| 10 \| 11 \| 12 \| 13 \| 14 \| 0 \| 1 \| \|<br>\| 9 \| 8 \| 7 \| 6 \| 5 \| 4 \| 3 \| 2 \| | ROTATE |
| 1 | DECREMENT | CIRCULATING TIME-BASE COUNTER (CTBC)<br>\| 9 \| 10 \| 11 \| 12 \| 13 \| 14 \| 0 \| \|<br>\| 8 \| 7 \| 6 \| 5 \| 4 \| 3 \| 2 \| 1 \| | ROTATE |
| 0 | RELOAD | CIRCULATING TIME-BASE COUNTER (CTBC)<br>\| 8 \| 9 \| 10 \| 11 \| 12 \| 13 \| 14 \| \|<br>\| 7 \| 6 \| 5 \| 4 \| 3 \| 2 \| 1 \| 0 \| | INCREMENT |

FIGURE 7
(PAGE 3 OF 3)

TIME-SLICED MODULAR PULSE-WIDTH MODULATION CIRCUIT

BACKGROUND OF THE INVENTION

1. Field of the Invention

The present invention relates to digital-to-analog converters using pulse width modulation (PWM) and, more particularly, to a PWM circuit for generating multiple independent output signals.

2. Art Background

It is well known in the art to use microcontrollers in applications such as closed-loop control and digital signal processing. Such applications are utilized in products such as modems, motor controllers, engine controllers, and medical instrumentation, to name just a few. In the field of microcontrollers, it is also well known to use pulse width modulation (PWM) outputs to implement digital to analog (D/A) conversion. Compared to other forms of D/A converters, PWM outputs provide an economical, yet powerful, way of achieving D/A conversion.

An example of such a PWM output circuit can be found implemented in a microcontroller manufactured by Intel Corporation of Santa Clara, Calif., the Assignee of the present application. As illustrated in FIG. 1, the contents of time-base counter 100 (of 8-bit length) is incremented every state time. When the contents of counter 100 equals 0, the PWM output is set high. When the contents of counter 100 matches the value stored in duty-cycle register 120, the PWM output is switched low. This is accomplished through the duty-cycle comparator 110, which activates its match output 150 when the two values are equal. When counter 100 again overflows (contents is 0), the PWM output is again switched high. A typical output waveform with various duty cycles is shown in FIG. 2. Note that when the contents of duty-cycle register 120 equals 0, the PWM output is always low, representing 0% duty cycle. As shown in FIG. 2, the duty cycle can be controlled by the duty-cycle register 120, which can be programmed as the application requires. While the PWM illustrated in FIG. 1 provides for various duty cycles under software control, the period of the PWM cycle is fixed. This PWM configuration is capable of generating only a single PWM output with a fixed frequency and software-controlled duty cycle.

FIG. 3 illustrates another form of prior art PWM implemented in a microcontroller manufactured by Intel Corporation. As shown in FIG. 3, three different PWM outputs can be generated by connecting multiple "PWM channels" (shown here as 310, 320, 330) to the time-base counter 300, each containing its own duty cycle register 311, duty cycle comparator 312, and output flip/flop 314. The overflow signal 340 sets all PWM outputs high at the same time, while each PWM output is switch low independently by the match signal 313. While this approach permits multiple PWM outputs with independent duty cycles, counter 300 determines the period for all the PWM outputs. Thus, this implementation is unsuitable for applications in which the different PWM-driven components require different input frequencies.

A possible improvement to this multiple PWM output generator is to implement a longer time-base counter. As shown in the conceptual block diagram FIG. 4a, a 9-bit time-base counter 400 replaces the 8-bit time-base counter 300. The period of the PWM1 output is defined by the low-order 8 bits of the counter, while the period of the PWM2 output is defined by the high-order 8 bits of the counter. Since the time base defined by the bit-field [8, 1] changes state at half the rate of the time base defined by the bit-field [7,0], the periods of the two PWM outputs differ by a factor of 2. This is an improvement over the method described above in that the periods of the PWM outputs need not be the same, though they are related. The two output waveforms are illustrated in FIG. 4b. Note that the PWM duty cycle is independently specified in each PWM channel's dedicated duty cycle register 412.

While this approach permits two PWM channels to operate with different (though related) periods, as it is shown here the period for each PWM channel is fixed by the hardware. If the overall period of the counter 400 is T, then the period of PWM1 will be T/2, while the period of PWM2 will be T.

An enhancement of this approach, shown in FIG. 5, allows either of the two available periods to be used with each PWM channel. Unfortunately, this additional capability is attained only at the cost of adding a multiplexer 513 at the input to the comparator 515 for each PWM channel. This multiplexer permits the selection of either bits [7,0] or bits [8,1] from the time-base counter 500 to be used as the basis of the PWM period.

More potential PWM periods can be created by increasing the number of bits in the time-base counter 500. However, the size of each multiplexer will be proportional to the number of potential periods (frequencies). Moreover, as a separate multiplexer is required for each PWM channel, the incremental silicon area required for an additional PWM channel is significant.

As described, the present invention allows a single time-base counter to generate concurrent and independent PWM outputs of different (though related) periods. As described, the present invention provides the means for incremental implementation of additional PWM channels with a minimum of additional silicon area.

SUMMARY OF THE INVENTION

Therefore, it is an object of the present invention to use a single counter to provide a different period for each of multiple PWM output channels.

It is further an object of the present invention to be able to program the period for each PWM channel.

It is another object of the present invention to minimize additional silicon required for the incremental implementation of PWM channels.

An apparatus for supporting multiple PWM output channels of different periods and duty cycles using time-multiplexing of time bases is disclosed. A circulating time-base counter is used to provide the various fundamental time bases (periods) for each PWM channel. The circulating time-base counter is incremented, rotated, or held constant according to the contents of a state counter, which is clocked by the system clock. As the contents of the circulating time-base counter are rotated, a plurality of values are generated, each representing one value of its corresponding time base. Each PWM channel module comprises a time-base match unit, a duty-cycle control unit, and an output control block. The time-base match unit in each individual PWM channel module determines when the value produced by the circulating time-base counter is valid for use as the PWM's programmed time-base by comparing its programmed time-base register with the contents of the state counter. The duty cycle control unit determines when the PWM output should be set and reset so as to produce the requisite duty cycle by comparing the programmed contents of its duty-cycle register with the value output by the circulating time-base counter. The output control block accepts set and reset signals from the duty control unit, when validated by the time-base match unit, to control the actual PWM output. The output control block can also comprise synchronization logic to align all PWM outputs (despite the fact that they are triggered at different clocks).

BRIEF DESCRIPTION OF THE DRAWINGS

FIG. 4b is a diagram illustrating the output waveform produced by the multiple channel PWM output circuit of FIG. 4a.

FIG. 7 is a diagram of the state sequence of the PWM output system using a 15-bit circulating time-base counter.

DETAILED DESCRIPTION OF THE INVENTION

An apparatus and method for supporting multiple-channel PWM outputs of different periods and duty cycles is disclosed. In the following description, for purposes of explanation, specific numbers, bits, registers, counters, comparators, and signals, etc. are set forth in order to provide a thorough understanding of the present invention. However, it will be apparent to one skilled in the art that the present invention may be practiced without these specific details. In other circumstances, well known circuits and devices are shown in block diagram form in order not to obscure the present invention unnecessarily.

Figure 1:
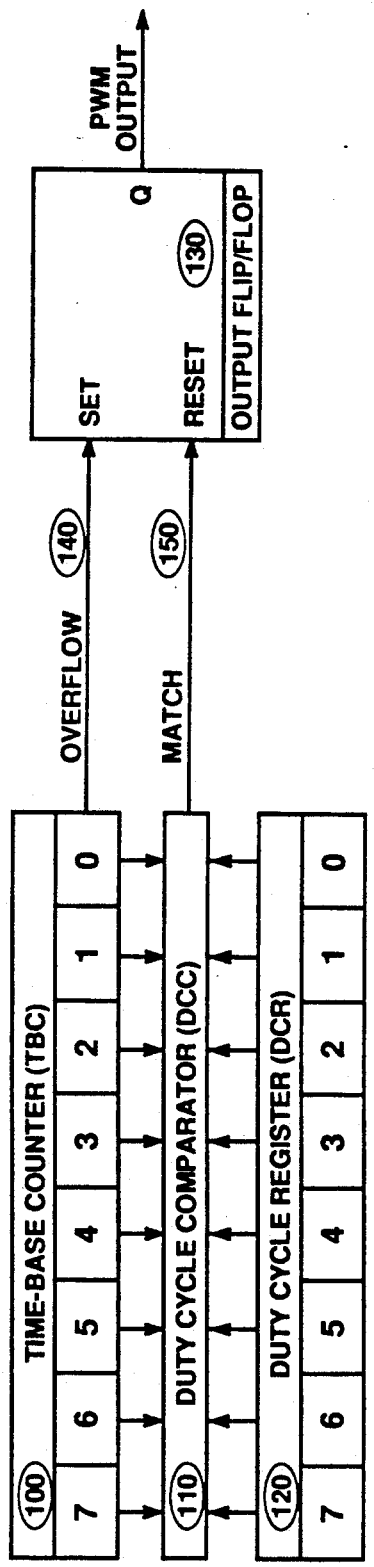
FIG. 1 is a schematic block diagram of a PWM output circuit in the prior art.
Figure 2:
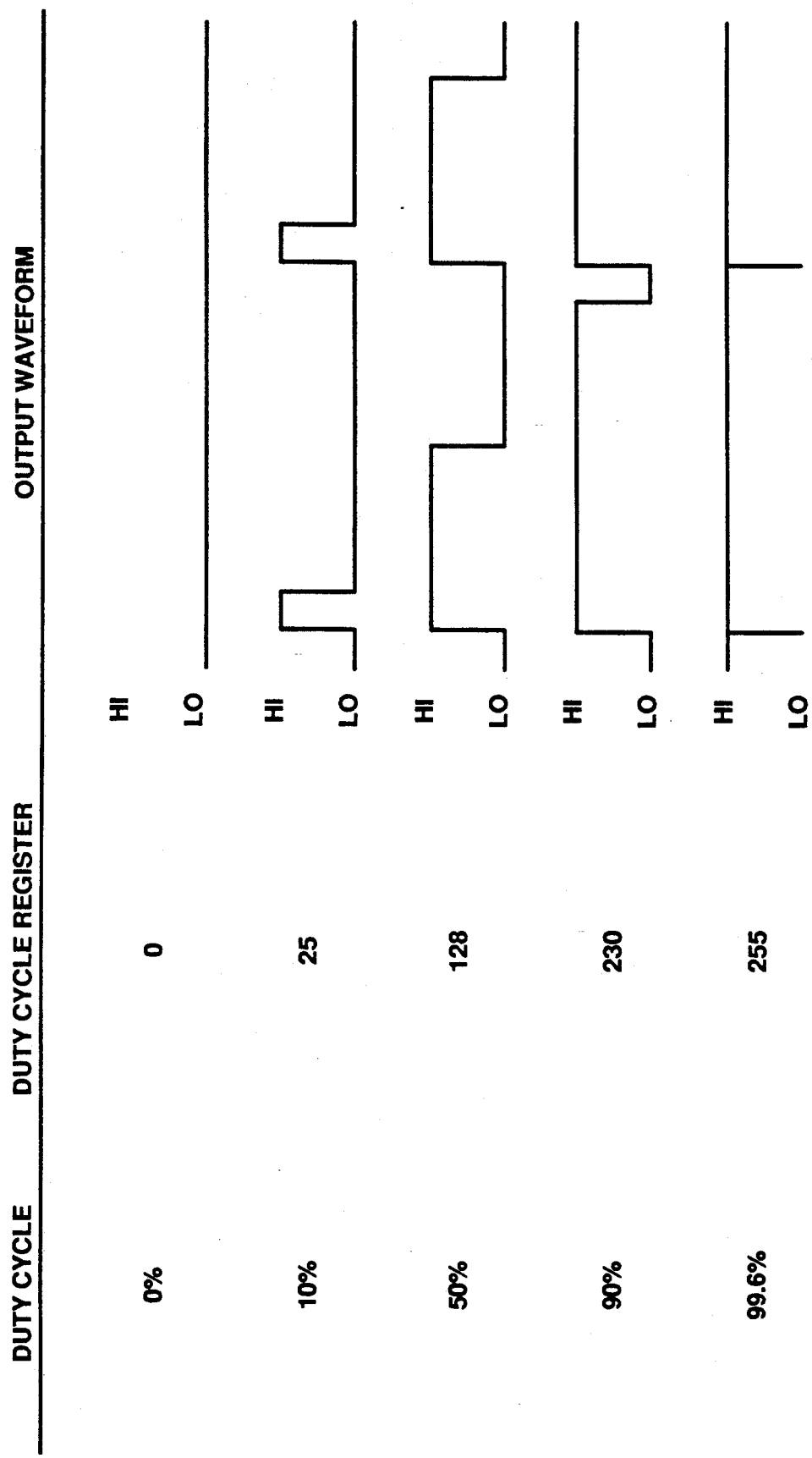
FIG. 2 is a diagram illustrating the output waveform produced by the PWM output circuit in the prior art.
Figure 3:
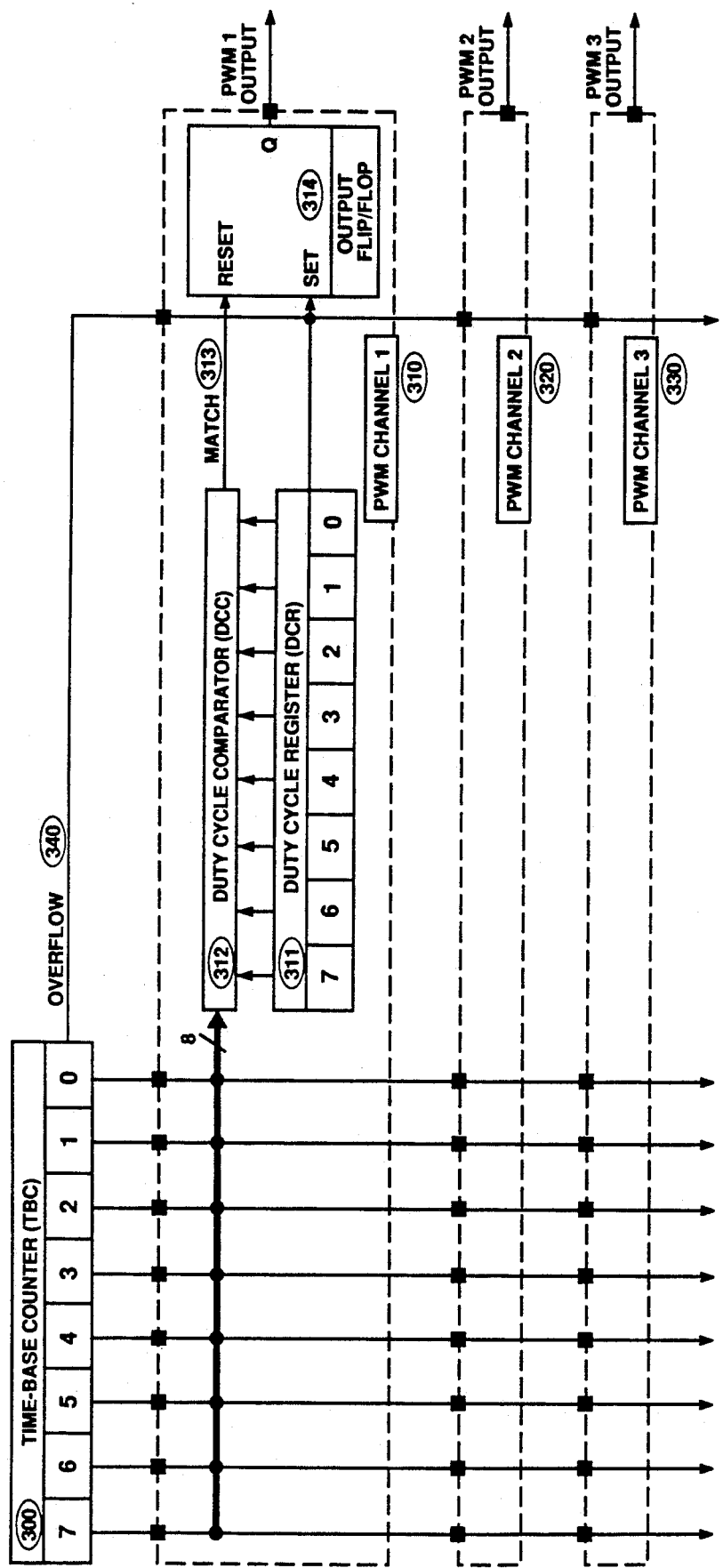
FIG. 3 is a schematic block diagram of a multiple channel PWM output circuit in the prior art.
Figure 4A:
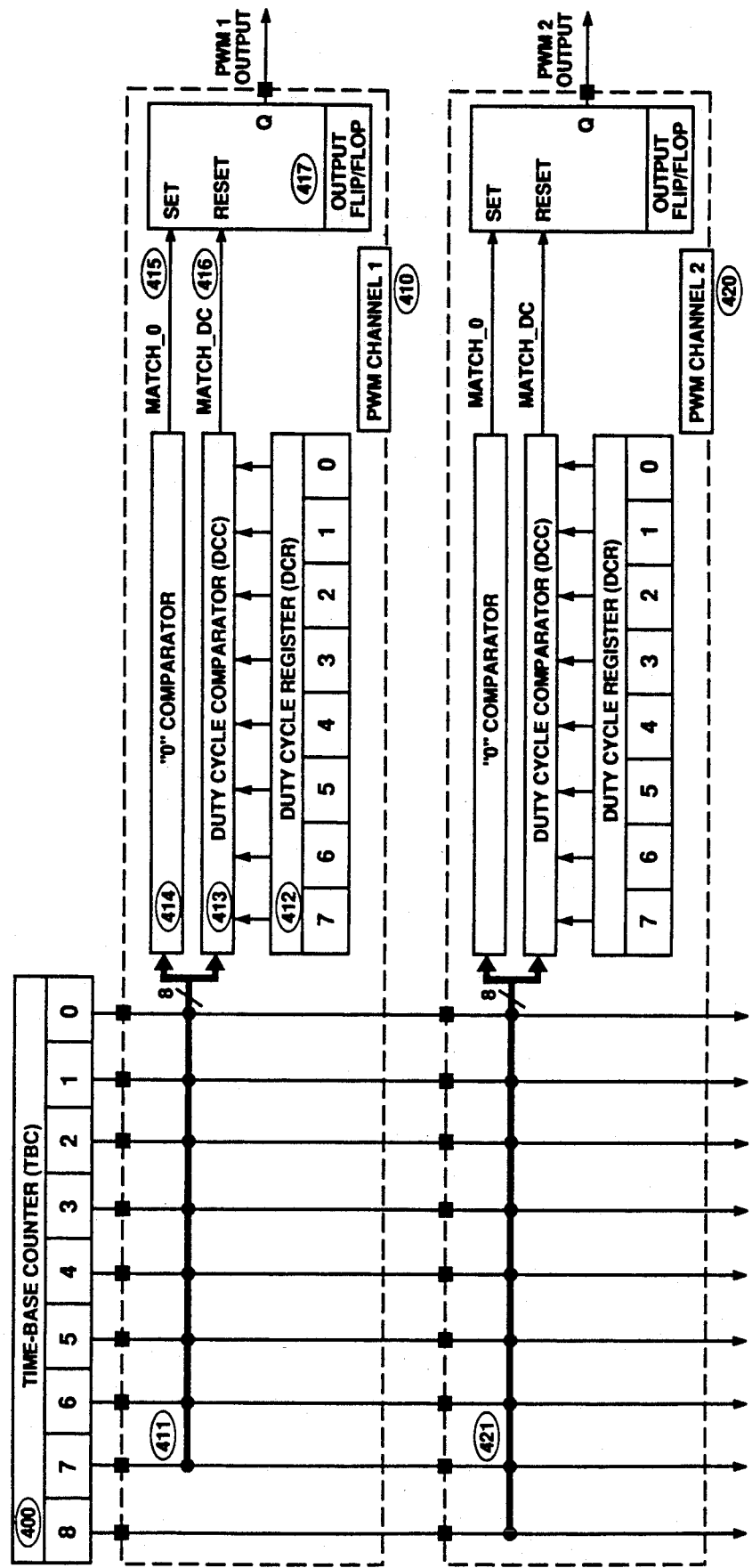
FIG. 4a is a conceptual block diagram of a multiple channel PWM output circuit capable of generating simultaneous outputs of different periods.
Figure 4B:
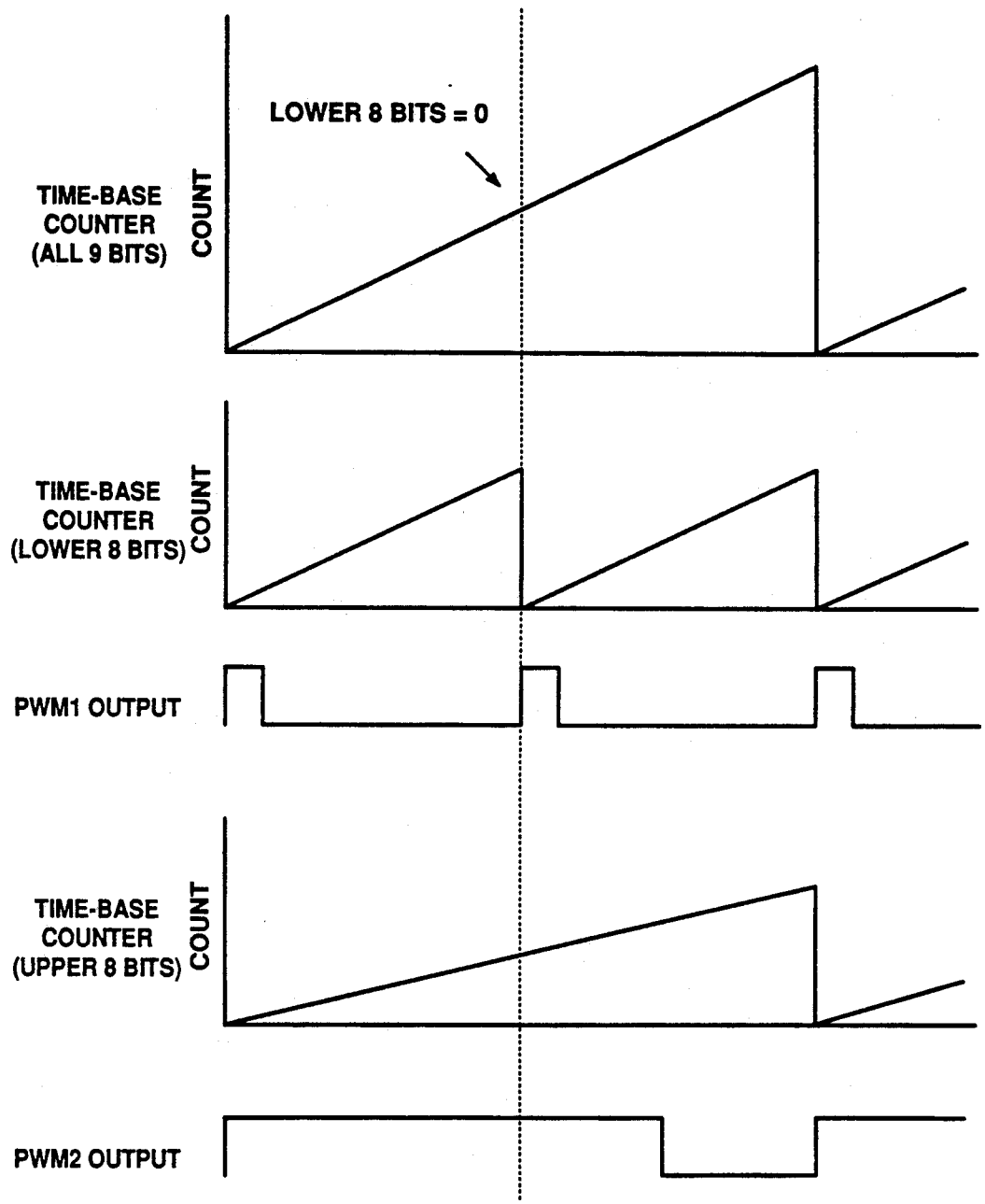
Figure 5:
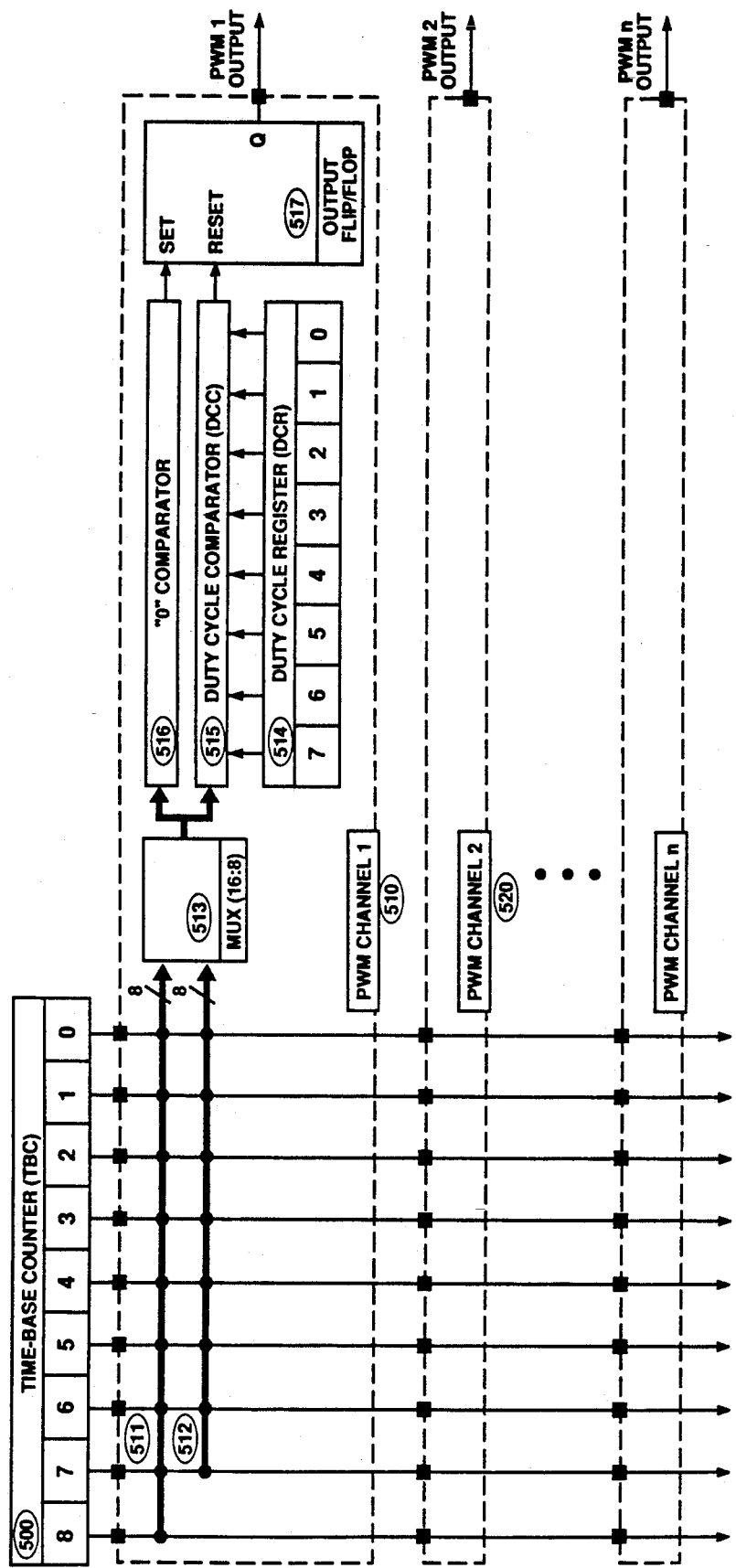
FIG. 5 is a conceptual block diagram of a multiple channel PWM output circuit supporting programmable (selectable) periods.

The present invention replaces the hardware multiplexing required in FIG. 5 with time-multiplexing, such that the bit-fields [7, 0] and [8, 1] that represent the two available time-bases would appear on alternate clock cycles on the same 8 connections to the time-base counter. This would permit the physical multiplexer 513 to be replaced by a register (1 bit) to select which state cycle to activate the comparators 515 and 516.

Figure 6:
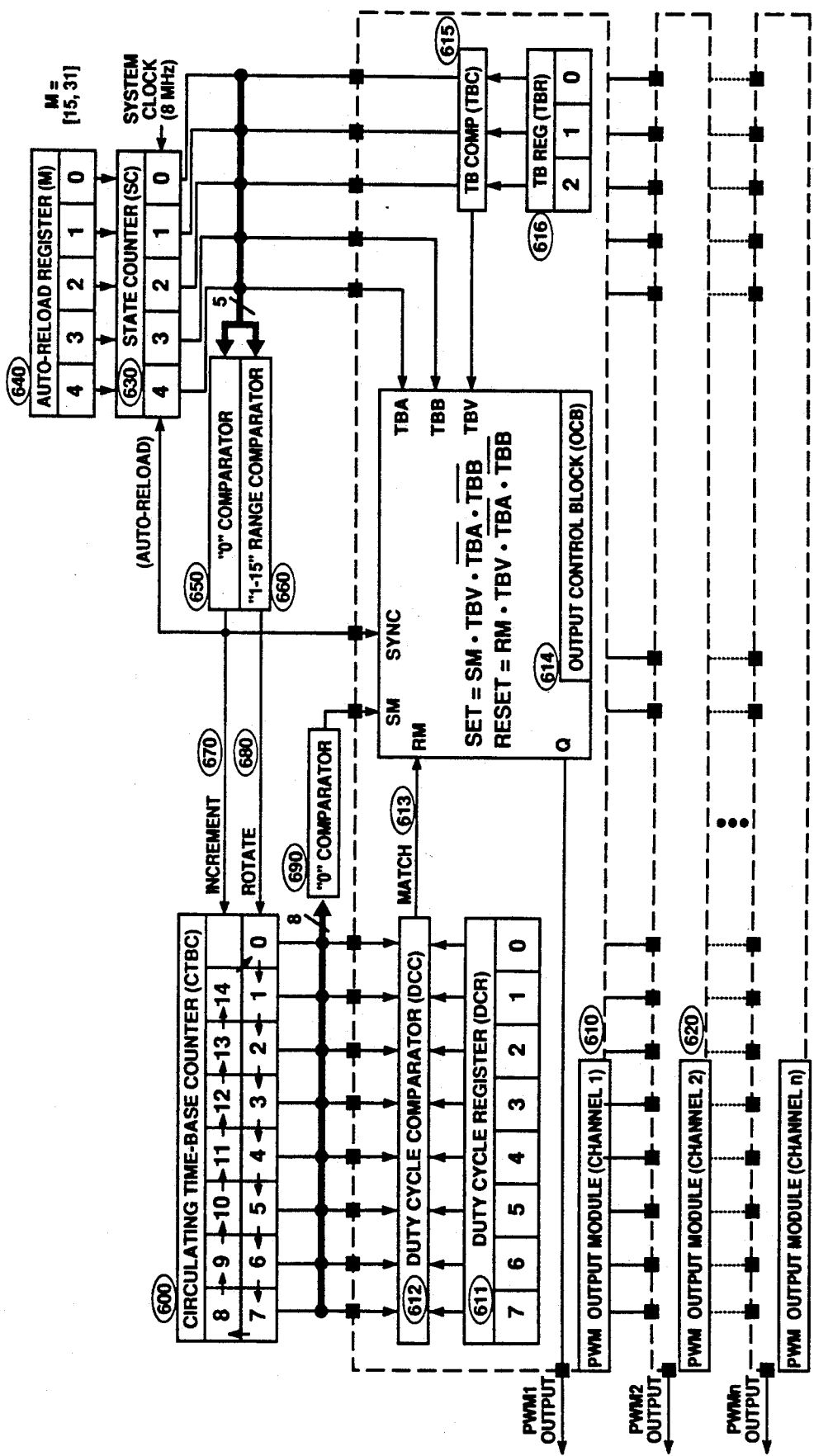
FIG. 6 is a schematic block diagram of a PWM output system incorporating the teaching of the present invention.

Reference is now made to FIG. 6, where a functional block diagram of a system incorporating the teachings of the present invention is shown. The system consists of a circulating time-base counter 600, a state counter 630, an auto-reload register 640, a first "0" comparator 650, a "1-15" range comparator 660, and a second "0" comparator 690. The system also includes at least one PWM "channel" module 610. It should be apparent to those skilled in the art that the present invention can be most advantageously utilized to support a plurality of PWM modules so as to generate multiple PWM outputs.

The 15-bit circulating time-base counter 600 provides the various fundamental time bases for each PWM output module 610. A total of 8 time bases are available (1 additional for each bit beyond the basic 8-bit time-base counter). The contents of the circulating time-base counter 600 are incremented, rotated, or held constant according the contents of a state counter 630. It should be apparent that those skilled in the art can easily use a decrementing time-base counter to achieve the same functionality as an incrementing counter.

This state counter 630 is loaded with a value ("M") generated from the auto-reload register 640, where the value M is programmable through software. In this preferred embodiment, M can be in the range of 15 to 31, thus creating a minimum of 16 states for the contents of the state counter 630 as it decrements from M to 0. The state counter 630 is clocked by the system clock, shown in this example as 8 MHz. The contents of the state counter 630 is checked by the "0" and "1-15" comparators (650, 660) for two sets of occurrences: whether the contents is 0 and whether the contents is in the range 1 through 15. When the value of the state counter 630 is 0, an increment signal 670 is activated from the "0" comparator 650 to cause the circulating time-base counter 600 to increment. The value of 0 also causes the state counter 630 to be auto-reloaded with the value "M" from the auto-reload register 640. When the value of the state counter 630 is in the range of 1 through 15, a rotate signal 680 is activated, causing the contents of counter 600 to be rotated by on bit position (to the left, as shown). Note that the range of permissible values of M in the auto-reload register 640 provides an additional degree of flexibility in time base selection. In the example, a minimum of M of 15 is required to provide enough states for the circulating time-base counter to increment and rotate through its 15 bit positions.

The PWM module 610, as described hereinafter, is only for illustration purposes such that the present invention can be better understood. Furthermore, although the present invention is now described with reference to its use with a 15-bit circulating time-base counter and 8-bit PWM resolution environment, it will be apparent to those skilled in the art that other configurations are also available for incorporating the teachings of the present invention. Each PWM module (610, 620, etc.) comprises a time-base register 616, a time-base comparator 615, a duty cycle register 611, a duty cycle comparator 612, and an output control block 614. The time-base comparator 615 in each individual PWM channel module 610 determines when the value produced by the circulating time-base counter 600 is valid for use as the PWM's programmed time-base by comparing its programmed time-base selector with the contents of the state counter 630. In this example, the time-base register 616 will contain a value of 0 to 7, representing one of the 8 available time bases. Accounting for internal delays, these time bases appear at the output of the time-base counter 600 when the state counter 630 contains values between 7 and 0 (see FIG. 7).

The PWM output is set when an active output from "0" comparator 690 is coincident with a valid time base state as represented by signals TBA, TBB, and TBV. The duty cycle comparator 612 determines when the PWM output should be reset by sending a RM signal to output control block 614 so as to produce the requisite duty cycle by comparing the programmed contents of the duty-cycle register 611 with the value output by the circulating time-base counter 600.

The output control block 614 accepts SM and RM signals, which can be validated by the TBV signal from the time-base comparator 615 to control the actual PWM output. The output control block 614 can also comprise synchronization logic (details not shown) to align all PWM outputs to compensate for the fact that each PWM output is triggered at different clocks. Such synchronization logic would record the set and reset actions as they are generated according to the equations shown below:

$$SET = SM*TBV*TBA*TBB$$

$$RESET = RM*TBV*TBA*TBB$$

but delay their effect until a sync input 670 is received from "0" comparator 650. Thus all PWM outputs change state (if required) at the same state of the state counter 630.

I claim:

1. A PWM output circuit for generating a plurality of PWM outputs, each of said PWM outputs having a plurality of periods and duty cycles, said PWM output circuit comprising:
    N-bit state counter for counting from a first number M to a second number Z, said state counter being reloaded to said first number M upon reaching said number Z, wherein said state counter produces $(M-Z+1)$ state counts in one iteration;
    first compare means coupled to said N-bit state counter for generating a ROTATE signal upon each transition of said state counter between a third number Q and said second number Z, wherein $M >= Q > Z$;
    second compare means coupled to said N-bit state counter for generating a COUNT signal when said state counter reaches said second number Z;
    circulating Q-bit time-base counter coupled to said first and second compare means for generating a plurality of values in response to said COUNT and ROTATE signals, said circulating counter shifting its contents upon receipt of said ROTATE signal, said circulating counter modifying its values in a fixed direction upon receipt of said COUNT signals;
    third compare means coupled to said circulating Q-bit time-base counter for generating an SM signal when the less significant bits from said circulating Q-bit time-base counter equals a third predetermined number; and
    PWM module means coupled to said circulating Q-bit time-base counter and said state counter and responsive to said SM signal for generating said plurality of PWM outputs, each of said PWM outputs having a duty cycle and a period, said duty cycle and period being determined by setting and resetting each PWM output as said circulating counter changes and rotates its values such that said plurality of PWM outputs are generated from said PWM module means with said PWM outputs having various duty cycles and periods.

2. A PWM output circuit according to claim 1, wherein said PWM module means comprises a plurality of PWM channel units for generating a plurality of PWM outputs with each having a duty cycle and a period, each said PWM channel units comprising:
    duty cycle generating means for a PWM output by resetting said PWM output when a predetermined subset of bits from said circulating Q-bit time-base counter is equal to a second predetermined number, and setting said PWM output when the less significant bits from said circulating Q-bit time-base counter equals a third predetermined number.

3. The PWM output circuit according to claim 2, wherein said duty cycle generating means comprises:
    duty cycle control means coupled to said circulating Q-bit time-base counter for generating a RM signal when the less significant bits from said circulating Q-bit time-base counter is equal to a second predetermined number;
    time-base select means coupled to said N-bit state counter for generating a TBV signal when the contents of said state counter equals a fourth predetermined number; and
    output control means coupled to said time-base select means for producing said PWM output, said PWM output having a first level while both said RM signal from said duty cycle control means and said TBV signal from said time-base select means are present and a second level when both said SM signal from said third compare means and said TBV signal from said time-base select means are present.

4. A PWM output circuit according to claim 3, wherein said third compare means coupled to said N-bit state counter also generates a SYNC signal when the contents of said N-bit state counter equals Z, each of said PWM channel units further comprising:
    signal latch means coupled to said third compare means for latching said PWM output until receipt of said SYNC signal such the each of said PWM outputs is synchronized to said SYNC signal.

5. A PWM output circuit according to claim 3, wherein $Q=15$, $N=5$, $Z=0$.

6. A PWM circuit according to claim 5, wherein said circulating counter is a 15-bit circulating counter with 8-bit subset bits and said PWM output control means comprises an RS-type flip-flop for generating said PWM output by setting and resetting said RS-type flip-flop.

* * * * *